United States Patent [19]
Yoshida

[11] Patent Number: 5,398,327
[45] Date of Patent: Mar. 14, 1995

[54] CENTRAL PROCESSING UNIT INCLUDING TWO-VALUED/N-VALUED CONVERSION UNIT

[75] Inventor: Yukihiro Yoshida, Ikoma, Japan
[73] Assignee: Sharp Kabushiki Kaisha, Osaka, Japan
[21] Appl. No.: 841,627
[22] Filed: Feb. 26, 1992
[30] Foreign Application Priority Data
Jun. 10, 1991 [JP] Japan .................... 3-137811
[51] Int. Cl.[6] .............................. G06F 13/00
[52] U.S. Cl. ................ 395/500; 364/259.8; 364/260; 364/239
[58] Field of Search .................. 395/325, 500

[56] References Cited
U.S. PATENT DOCUMENTS

| | | | |
|---|---|---|---|
| 3,601,702 | 8/1971 | Lender | 371/56 |
| 3,641,506 | 2/1972 | Cupp et al. | 395/550 |
| 3,879,710 | 4/1975 | Maxemchuk et al. | 395/200 |
| 4,302,690 | 11/1981 | Gollinger et al. | 307/451 |
| 4,905,097 | 2/1990 | Watanabe et al. | 358/456 |

Primary Examiner—Parshotam S. Lall
Assistant Examiner—Ayni Mohamed
Attorney, Agent, or Firm—Nixon & Vanderhye

[57] ABSTRACT

A central processing unit comprises a bidirectional circuit for converting a binary data and a binary address supplied from a binary logic circuit in the CPU into n-valued (n is an integer of 3 or larger) data and an n-valued address, respectively, and transmitting converted signals to the outside, and for converting n-valued data and an n-valued address supplied from the outside into binary data and a binary address, respectively, and transmitting converted signals to the binary logic circuit.

13 Claims, 6 Drawing Sheets

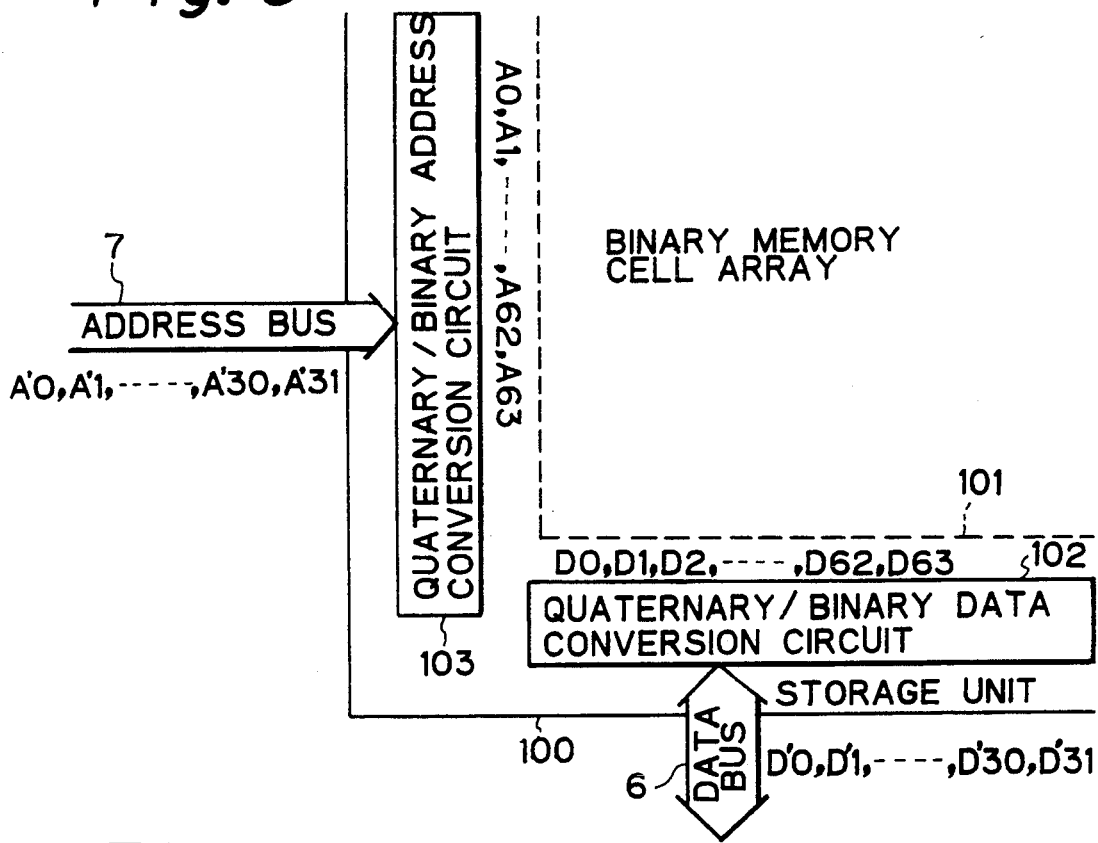
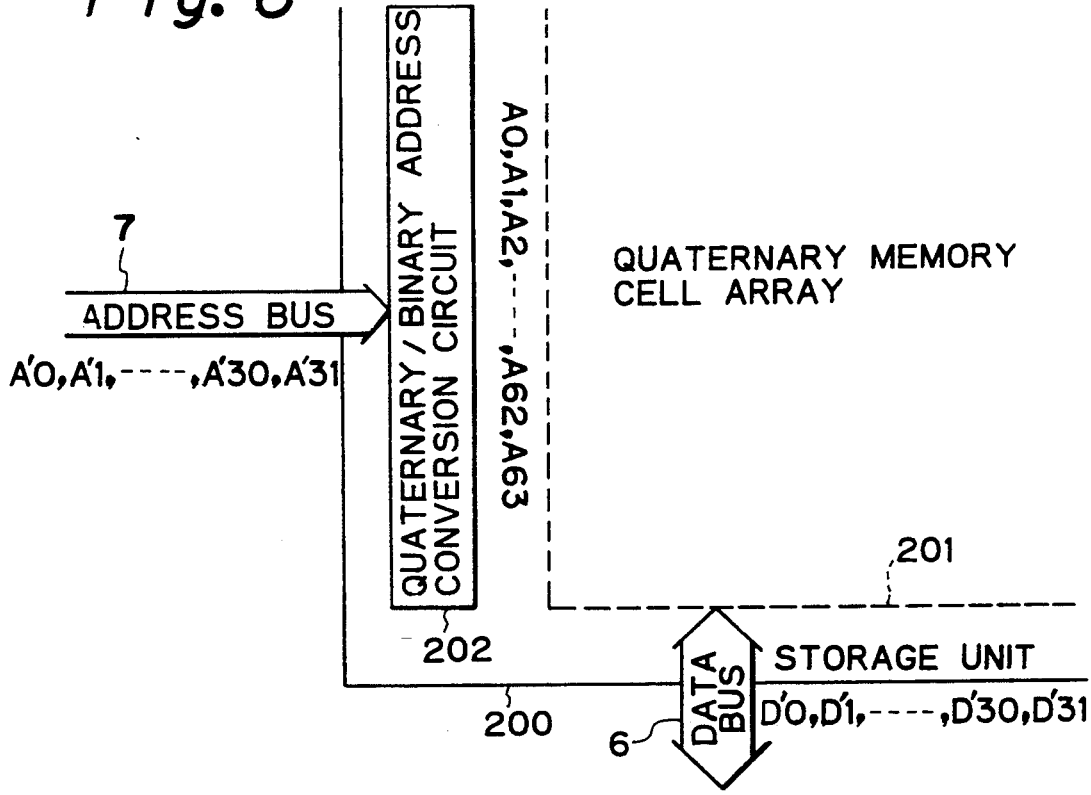

Fig. 9A, Fig. 9B, Fig. 9C

CENTRAL PROCESSING UNIT INCLUDING TWO-VALUED/N-VALUED CONVERSION UNIT

BACKGROUND OF THE INVENTION

1. Field of the Invention

The present invention relates to a central processing unit (CPU) including a two-valued (or binary)/n-valued conversion unit and to an electronic computer apparatus having the central processing unit.

2. Description of the Related Art

As is well known, a CPU performs operations on data as a specified group of binary digits, or bits, known as a word. The word size (or bit length) of the CPU is becoming progressively longer with improving performance of the CPU. Therefore, the number of signal lines constituting a data bus or an address bus, e.g. hence the bus width, is becoming increasingly wide. The conventional standard 32-bit CPU requires a 32-line parallel bus. However, a narrower bus width of the CPU is desirable for the advancing size reduction and the higher reliability of the CPU.

Conventionally, the only method of reducing the bus width has been to use a time-sharing system. However, this time-sharing system has a disadvantage that the signal transmission speed that is, the bus speed is slow. This disadvantage is very serious because the bus speed of the CPU determines the performance, such as a high-speed operability of the computer system.

SUMMARY OF THE INVENTION

It is therefore an object of the present invention to provide a CPU including buses each having a smaller width and transmitting digital data at the same rate as the conventional CPU.

A CPU according to the present invention comprises unit for converting binary signals supplied from a binary logic circuit in the CPU into n-valued (n is an integer of 3 or larger) signals and transmitting converted signals to the outside, and unit for converting n-valued signals supplied from the outside into binary signals and transmitting converted signals to the binary logic circuit.

Therefore, the number of signal lines of a data bus or an address bus, coupled between the CPU and the outside, can be reduced without decreasing the data transmission rate.

The converting unit for binary signals may include unit for converting a binary data and a binary address into an n-valued data and an n-valued address, respectively, and the converting unit for n-valued signals may include unit for converting an n-valued data and an n-valued address into a binary data and a binary address, respectively.

In a preferred embodiment the converting unit for binary signals and the converting unit for n-valued signals are composed of a bidirectional binary/n-valued conversion circuit including logical circuits.

A computer comprises the central processing unit according to the present invention and further comprises a storage unit including an n-valued/binary address conversion circuit for converting an n-valued address through an address bus from the central processing unit into a binary address.

Preferably the storage unit includes a binary memory section and a bidirectional n-valued/binary data conversion circuit coupled to the binary memory section and to the central processing unit via the data bus.

Instead of the binary memory section and the bidirectional n-valued/binary data conversion circuit the storage unit may include an n-valued memory section coupled to the central processing unit via the data bus.

Further objects and advantages of the present invention will be apparent from the following description of the preferred embodiments of the invention as illustrated in the accompanying drawings.

BRIEF DESCRIPTION OF THE DRAWINGS

FIG. 5 is a block diagram of an example of electronic computer apparatus including the CPU in FIG. 1;

FIG. 6 is a block diagram of another example of electronic computer including the CPU in FIG. 1;

FIGS. 9A–9C are diagrams for explaining an algorithm for converting ternary data into binary data.

DESCRIPTION OF THE PREFERRED EMBODIMENTS

Description will now be made of preferred embodiments of the present invention.

Figure 1:
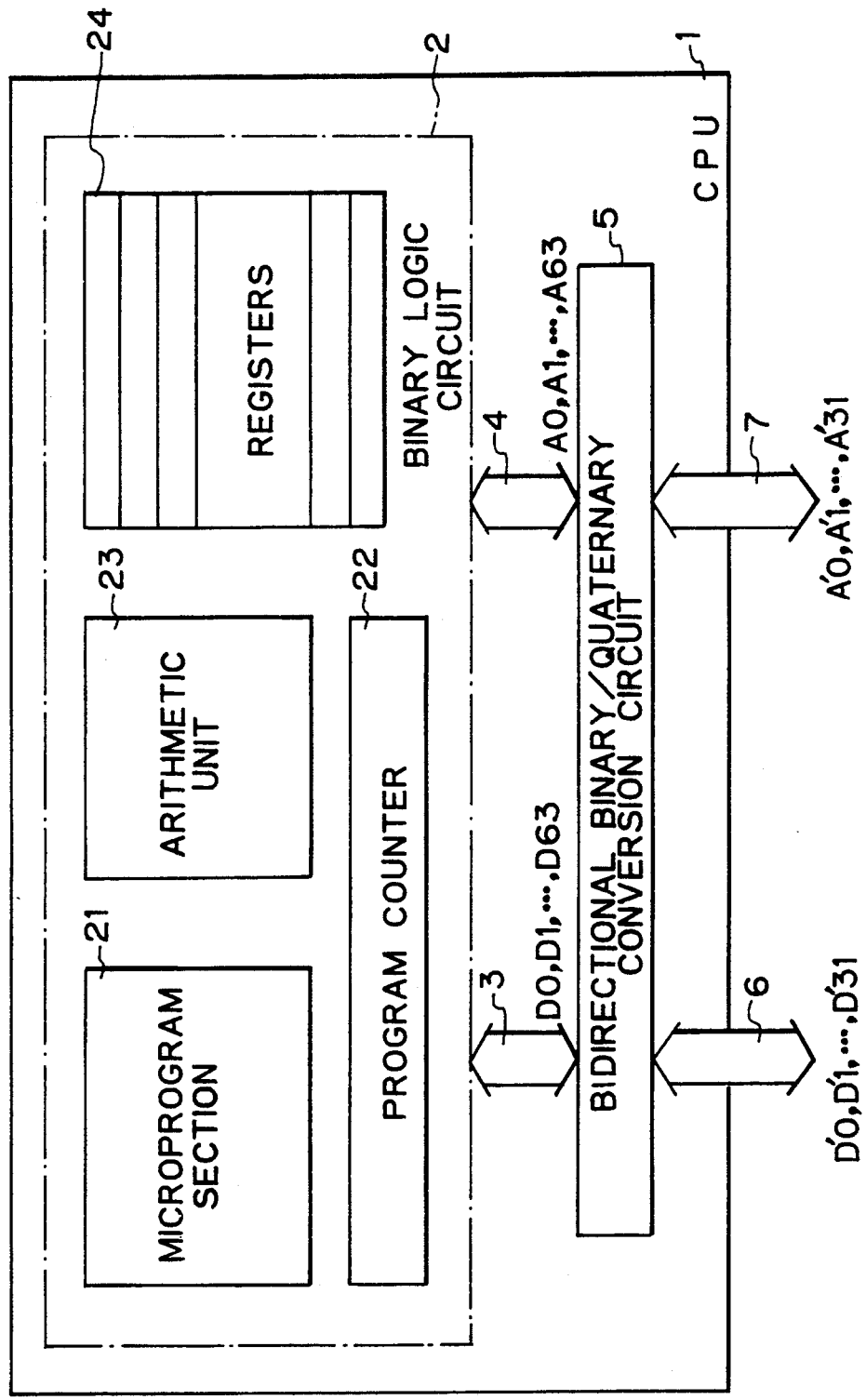
FIG. 1 is a block diagram of an embodiment of a CPU according to the present invention.

FIG. 1 shows an embodiment of a CPU according to the present invention. The 64-bit CPU 1 includes a binary logic circuit 2 and a bidirectional binary/quaternary conversion circuit 5. The binary logic circuit 2 is provided to perform a conventional function, for example computation and processing operations upon data inputted to the CPU 1. The logic circuit 2 comprises a microprogram section 21, a program counter 22, an arithmetic unit 23, and registers 24. The binary logic circuit 2 is connected to the binary/quaternary conversion circuit 5 via a binary data bus 3 and a binary address bus 4 each comprising 64 signal lines. The logic circuit 2 outputs a 64-bit address to the address bus 4, and receives 64-bit data through the data bus 3.

The bidirectional binary/quaternary conversion circuit 5 performs conversion of binary data to quaternary data and conversion of quaternary data to binary data. When binary data is inputted through the binary data bus 3, the conversion circuit 5 converts the binary data into the quaternary data and outputs the quaternary data via a quaternary data bus 6. Conversely, when a quaternary data is inputted via the quaternary bus 6, the conversion circuit 5 converts the quaternary data into the corresponding binary data and outputs the binary data to the binary logic circuit 2 via the binary data bus 3. On the other hand, when a binary address is inputted through the binary address bus 4, the conversion circuit 5 converts the binary address into the corresponding quaternary address and outputs the quaternary address to the quaternary address bus 7. The quaternary data bus 6 and the quaternary address bus 7 conduct signals with the same amount of information as the binary data bus 3 and the binary address bus 4. Since each signal is represented in quaternary logic, the number of signal lines constituting the bus 6 or 7 is 32.

In order to give a detailed description of conversion of data and address in the conversion circuit 5, multi-valued logic will be described. A multi-valued logic variable $x_k$ ($k=1, 2, 3, \ldots$) can be defined as follows.

$$X_k = \bigvee_{M=0}^{N-1} \frac{M}{N-1}\left(X_k \equiv \frac{M}{N-1}\right)$$

$$\overline{X}_k = \bigvee_{M=0}^{N-1}\left(1 - \frac{M}{N-1}\right)\left(X_k \equiv \frac{M}{N-1}\right)$$

where the symbol V denotes the logical OR, and (A≡B) denotes an operator which makes the value in parentheses 1 when A equals B and 0 when A differs from B, and also N designates a multi-valued number.

N is equal to 4 in the case of quaternary logic, and $x_k$ and the negation of $x_k$ are as shown below.

$$X_k = \tfrac{1}{3}(X_k \equiv \tfrac{1}{3}) + \tfrac{2}{3}(X_k \equiv \tfrac{2}{3}) + (X_k \equiv 1)$$
$$\overline{X}_k = (X_k \equiv 0) + \tfrac{2}{3}(X_k \equiv \tfrac{1}{3}) + \tfrac{1}{3}(X_k \equiv \tfrac{2}{3})$$

In multi-valued logic, the following relation always holds, and can be used for converting a binary data into a quaternary data or a quaternary data into a binary data.

$$\bigvee_{M=0}^{N-1}\left(X_k \equiv \frac{M}{N-1}\right) = 1$$

when $I \neq J$ $$\left(X_k \equiv \frac{I}{N-1}\right)\left(X_k \equiv \frac{J}{N-1}\right) = 0$$

when $I = J$ $$\left(X_k \equiv \frac{I}{N-1}\right)\left(X_k \equiv \frac{J}{N-1}\right) = \left(X_k \equiv \frac{I}{N-1}\right)$$

$$\left(X_k \equiv \frac{I}{N-1}\right) + \left(X_k \equiv \frac{J}{N-1}\right) = \left(X_k \equiv \frac{I}{N-1}\right)$$

When 64-bit data as a group of binary digits D0, D1, ..., and D63 are given from the binary logic circuit via the binary data bus 3, the conversion circuit 5 obtains a 32-bit data as a group of quaternary digits D'0, D'1, ..., and D'31, in accordance with the following equation, and outputs the data to the quaternary data bus 6.

$$D'0 = \tfrac{1}{3}\overline{D1}\,D0 + \tfrac{2}{3}D1\,\overline{D0} + D1\,D0$$
$$D'1 = \tfrac{1}{3}\overline{D3}\,D2 + \tfrac{2}{3}D3\,\overline{D2} + D3\,D2$$
$$\vdots$$
$$D'30 = \tfrac{1}{3}\overline{D61}\,D60 + \tfrac{2}{3}D61\,\overline{D60} + D61\,D60$$
$$D'31 = \tfrac{1}{3}\overline{D63}\,D62 + \tfrac{2}{3}D63\,\overline{D62} + D63\,D62$$

Consequently, the signal, representing the quaternary digit converted in accordance with this equation, has four amplitudes, called state 0, state $\tfrac{1}{3}$, state $\tfrac{2}{3}$, and state 1.

Figure 2:
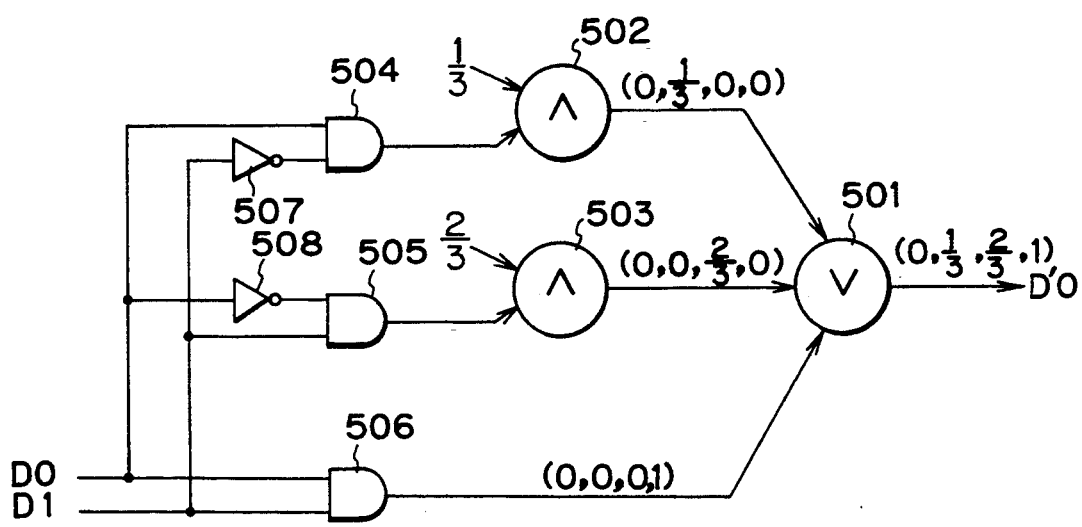
FIG. 2 is a logic circuit for converting binary data into quaternary data in a binary/quaternary conversion circuit of the CPU in FIG. 1.

In order to perform a logical operation such as this, the conversion circuit 5 is provided with a logic circuit as shown in FIG. 2. FIG. 2 shows only the logic circuit for obtaining quaternary digit D'0. In actuality, the conversion circuit 5 is also provided with a plurality of logic circuits for obtaining other quaternary digits D'1, ..., and D'31.

Description will be made of the circuit in FIG. 2. Reference numeral 501 denotes a quaternary OR circuit, and 502 and 503 denote quaternary AND circuits. Outputs of the AND circuits 502 and 503 are connected to two of the three inputs of the OR circuit 501, and output of an AND circuit 506. Binary signals D0 and D1 are inputted to two inputs of the AND circuit 506. Signal D0 is applied to one input of AND circuit 504, while signal D1 is applied through an inverting amplifier 507 to the other input of the AND circuit 504. Signal D1 is applied to one input of the AND circuit 505, while signal D0 is applied through an inverting amplifier 508 to the other input of the AND circuit 505. A signal of state $\tfrac{1}{3}$ is applied to one input of the AND circuit 502, while output from the AND circuit 504 is applied to the other input of the AND circuit 502. A signal of state $\tfrac{2}{3}$ is applied to one input of the AND circuit 503, while output of the AND circuit 505 is applied to the other input of the AND circuit 503. Note that the symbol Λ indicates a logical AND, and the symbol V indicates a logical OR.

The relation of code conversion between the input binary digits D0 and D1 and the output quaternary digits D'0 is shown in TABLE 1.

The conversion circuit 5, when it receives a quaternary data of D'0, D'1, ..., and D'31 through the quaternary data bus 6, obtains binary data of D0, D1, ..., and D63 in accordance with the following equations, and outputs the binary data to the logical circuit via the binary data bus 3.

$$D0 = (D'0 \equiv \tfrac{1}{3}) + (D'0 \equiv 1)$$
$$D1 = (D'0 \equiv \tfrac{2}{3}) + (D'0 \equiv 1)$$
$$D2 = (D'1 \equiv \tfrac{1}{3}) + (D'1 \equiv 1)$$
$$D3 = (D'1 \equiv \tfrac{2}{3}) + (D'1 \equiv 1)$$
$$\vdots$$
$$D60 = (D'30 \equiv \tfrac{1}{3}) + (D'30 \equiv 1)$$
$$D61 = (D'30 \equiv \tfrac{2}{3}) + (D'30 \equiv 1)$$
$$D62 = (D'31 \equiv \tfrac{1}{3}) + (D'31 \equiv 1)$$
$$D63 = (D'31 \equiv \tfrac{2}{3}) + (D'31 \equiv 1)$$

Figure 3:
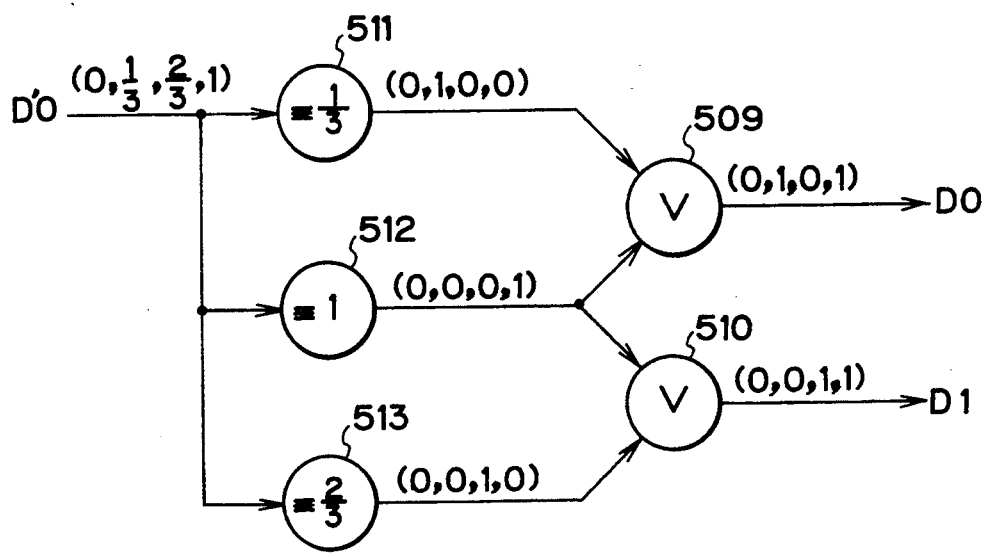
FIG. 3 is a logic circuit for converting quaternary data into binary data in the binary/quaternary conversion circuit of the CPU in FIG. 1.
Figure 4:
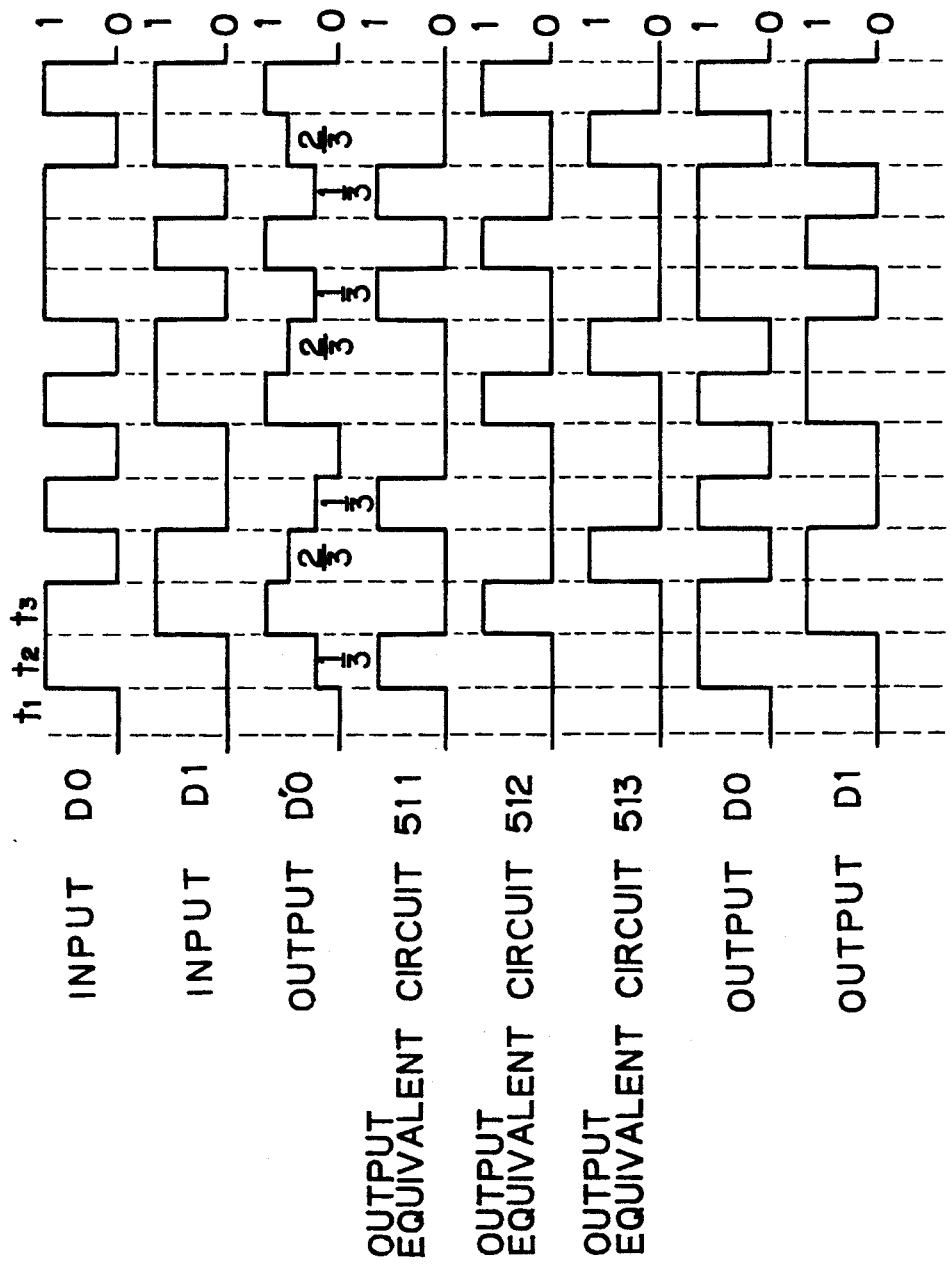
FIG. 4 is a timing chart showing the operation of the circuit in FIGS. 2 and 3.

The conversion circuit 5 is also provided with a logic circuit, shown in FIG. 3, for performing logical operations such as are presented above. FIG. 3 shows only a logic circuit for obtaining binary digits D0 and D1. In actuality, a plurality of logic circuits are provided for obtaining other binary digits D2, ..., and D63.

Description will now be made of the circuit of FIG. 3. Reference numerals 509 and 510 denote binary OR circuits, and 511 to 513 denote equivalent circuits. The equivalent circuit 511 outputs 1 only when an input is $\tfrac{1}{3}$ state, and outputs 0 when a signal other than $\tfrac{1}{3}$ state is inputted. The equivalent circuits 512 and 513 respectively output 1 only when an input signal is 1 for the former and $\tfrac{2}{3}$ for the latter, and output 0 when an input signal is other than 1 and $\tfrac{2}{3}$, respectively. Quaternary signal D'0 is applied to all of the inputs of the equivalent circuits 511 to 513. Output of the equivalent circuit 511 is connected to one input of the OR circuit 509, and output of the equivalent circuit 512 is applied to the other input of the OR circuit 509 and also to one input of the OR circuit 510. Output of the equivalent circuit 513 is connected to the other input of the OR circuit 510.

The relation between input signal D'0 and output signals D0 and D1 of the logic circuit is as shown in TABLE 1.

The conversion circuit 5 is provided with a circuit similar to the logic circuit in FIG. 2 for converting addresses, and this circuit converts a binary address of A0, A1, . . . , and A63 into a quaternary address of A'0, A'1, . . . , and A'31.

The operation of the above-mentioned CPU will now be described by reference to FIGS. 1 to 4. When the binary logic circuit 2 outputs a binary data of D0, D1, . . . , and D63 through the binary data bus 3, the binary/quaternary conversion circuit 5 converts the binary data into the corresponding quaternary data D'0, D'1, . . . , and D'31 by means of the logic circuit of FIG. 2, and outputs the quaternary data into the quaternary data bus 6. For example, when binary signals D0 and D1 are applied to the circuit 5 at time t1 as shown in the timing chart of FIG. 4, the conversion circuit 5 outputs quaternary signal D'0 of 0 state. When signals D0 and D1, applied at time t2, have amplitudes of 1 state and 0 state, respectively, the conversion circuit 5 outputs ⅓ state signal as digit D'0. When signals D0 and D1 applied at time t3 are both 1 state, the conversion circuit 5 outputs 1 state signal as digit D'0.

Conversely, when receiving quaternary data as a group of digits D'0, D'1, . . . , and D'31 through the quaternary data bus 6, the conversion circuit 5 converts the quaternary data into the corresponding binary data of D0, D1, . . . , and D63 by means of the logic circuit of FIG. 3, and outputs the binary data to the logic circuit via the binary data bus 3. For example, when a signal of 0 state is applied to the conversion circuit 5 as quaternary digit D'0 at time t1 in the timing chart of FIG. 4, the equivalent circuits 511 to 513 of the logic circuit in FIG. 3 all output 0, so that the OR circuits 509 and 510 output 0 state signals as binary digits D0 and D1. When a signal of ⅓ state is applied as quaternary digit D'0 at time t2, the equivalent circuits 511 to 513 output 1, 0, and 0 state signals, respectively. As a result, the OR circuit 509 outputs a signal of 1 state as digit D0, while the OR circuit 510 outputs 0 as digit D1. When a signal of 1 state is applied as quaternary digit D'0 at time t3, the equivalent circuits 511 to 513 output 0, 1, and 0 state signals, respectively, so that the OR circuits 509 and 510 both output 1 state signals as digits D0 and D1.

When receiving a binary address of A0, A1, . . . , and A63 supplied by the binary logic circuit 2, the conversion circuit 5 performs conversions same as mentioned above, and outputs a address as a group of quaternary digits A'0, A'1, . . . , and A'31 into the quaternary address bus 7.

As has been described, in the CPU according to this embodiment, binary data and a binary address supplied from the binary logic circuit 2 are converted by the binary/quaternary conversion circuit 5 into a quaternary data and a quaternary address, respectively, and they are outputted. Quaternary data supplied from outside is similarly converted by the conversion circuit 5 into binary data, and supplied to the binary logic circuit 2. Therefore, the data bus 6 and the address bus 7 connected with the CPU may comprise 32 signal lines, respectively, so that the number of signal lines can be reduced to a half of the conventional number of lines.

For simplicity of the description, a drawing is not shown, but the CPU has a control bus for controlling the peripheral devices. Therefore, the CPU is also provided with a bidirectional binary/quaternary conversion circuit for the control bus. The conversion circuit for the control bus may be involved in the bidirectional binary/quaternary conversion circuit 5.

Description will now be made of an electronic computer apparatus using the above-mentioned CPU. This electronic computer apparatus comprises the CPU in FIG. 1 and a storage unit 100 shown in FIG. 5. The storage unit 100 includes a binary memory cell array, a bidirectional quaternary/binary data conversion circuit 102, and a quaternary/binary address conversion circuit 103.

The data conversion circuit 102 is connected to the conversion circuit 5 of the CPU 1 shown in FIG. 1 via the data bus 6, and includes logic circuits of the same arrangement as shown in FIGS. 2 and 3. When receiving quaternary data D'0, D'1, . . . , and D'31 from the CPU, the data conversion circuit 102 converts the quaternary data into the corresponding binary data of D0, D1, . . . , and D63, and outputs the binary data to the binary memory cell array 101. Conversely, when receiving binary data from the binary memory cell array 101, the data conversion circuit 102 converts the binary data into the corresponding quaternary data, and outputs the quaternary data to the CPU.

The address conversion circuit 103 is connected to the conversion circuit of the CPU through the quaternary address bus 7, and is provided with logic circuits of the same arrangement as shown in FIG. 3. The address conversion circuit 103 receives a quaternary address of A'0, A'1, . . . , and A'31 through the quaternary data bus 7, converts the address into the corresponding binary address of A0, A1, . . . , and A63, and supplies the binary address to the binary memory cell array 101.

The operation of this computer apparatus will now be described. When the CPU outputs a quaternary address to access a storage location in the storage device 100, the storage device 100 receives the quaternary address through the quaternary address bus 7. The address conversion circuit 103 converts the quaternary address from the CPU into the corresponding binary address, and outputs it to the binary memory cell array 101. In a case where the CPU reads data, when a binary address is given from the address conversion circuit 103, the binary memory cell array 101 outputs binary data which corresponds to the specified address to the data conversion circuit 102. The data conversion circuit 102 converts the binary data into the corresponding quaternary data, and outputs the quaternary data to the CPU through the quaternary data bus 6. In a case where a data is to be stored in the storage device 100, quaternary data, supplied from the CPU through the quaternary data bus 6, is converted by the data conversion circuit 102 into binary data, which data is stored in a storage area at an address given by the address conversion circuit 103.

Another example of electronic computer apparatus including the CPU according to the present invention will now be described. The electronic computer apparatus is provided with the CPU and a storage unit 200 shown in FIG. 6. The storage unit 200 includes a quaternary memory cell array 201, and a quaternary/binary address conversion circuit 202.

The address conversion circuit 202 is connected to the conversion circuit of the CPU through the quaternary address bus 7, and is provided with logic circuits of the same arrangement as shown in FIG. 3. The address conversion circuit 202 receives a quaternary address of A'0, A'1, ..., and A'31 from the CPU via the quaternary address bus 7, converts the quaternary address into the corresponding binary address of A0, A1, ..., and A63, and supplies the binary address of A0, A1, ..., and A63 to the quaternary memory cell array 201.

When the CPU outputs a quaternary address to access a storage location in the storage unit 200, the address conversion circuit 202 receives this quaternary address through the quaternary address bus 7. The address conversion circuit 202 converts the quaternary address into the corresponding binary address, and outputs it to the quaternary memory cell array 201.

In a case where the CPU reads data, when a binary address is given from the address conversion circuit 202, the quaternary memory cell array 201 outputs quaternary data at the specified address through the quaternary data bus 6 to the CPU. On the other hand, when storing data into the memory storage 200, quaternary data supplied through the quaternary data bus 6 from the CPU is stored in a storage area corresponding to an address given from the address conversion circuit 202.

As described above, a quaternary signal is used to transmit data and addresses between the CPU and the storage unit 200, so that the number of signal lines constituting the data bus or the address bus can be decreased to a half of the number of signal lines required heretofore. In this embodiment, the quaternary memory cell array 201 stores quaternary data, so that the data conversion circuit is not required.

In the foregoing embodiments, though not shown in the drawings for simplicity's sake, in the above-mentioned electronic computer apparatus, various kinds of peripheral device controllers are connected to the CPU buses for controlling various kinds of peripheral devices. Therefore, the electronic computer apparatus is also provided with a quaternary/binary conversion circuit for addresses and data for the controllers as in the binary memory cell array in FIG. 5, and then the bus width can be similarly reduced.

An input/output device such as peripheral device controller, an interface coupled to a computer apparatus, or the like is also provided with internal buses for transmitting signals representing data, etc. The binary logic circuit within the CPU shown in FIG. 1 similarly includes internal buses. Internal buses in the input/output device or the CPU may be composed of a data bus, an address bus, and a control bus, or of one or two of them. A part of internal buses can be connected to outer buses such as buses of the first or second embodiments mentioned above.

Therefore, such input/output device may be also provided with a bidirectional binary/n-valued conversion circuit according to the present invention for internal buses. The bus width can be reduced without decreasing the data transmission rate.

The CPU using a quaternary signal has been shown as an embodiment, but if a multi-valued signal with a larger number of values than a quaternary signal is used, the number of signal lines can be reduced further. Generally, when an n-valued signal is used, if the number of signal lines is m, the number of expressed states by m signals is $N^m$. On the other hand, the number of states of signal represented by an n-bit binary signal is $2^n$. Since $N^m = 2^n$, $m = n \log 2/\log N$. For example, when a quaternary signal is used, $N=4$, and therefore, $m=n/2$, which means that the number of signal lines is reduced to $\frac{1}{2}$ compared with the conventional number of signal lines. Similarly, when $N=8$ or $N=16$, the number m of signal lines is reduced to $\frac{1}{3}$ in the former case or $\frac{1}{4}$ for the latter case.

In the embodiments described, a binary signal is converted into a quaternary signal, and supplied into the data bus and the address bus, but a binary signal may be converted into a ternary signal and supplied to a data bus and an address bus.

In the ternary logic, binary digits D0, D1, and D2 are converted into ternary digits D'0 and D'1 in accordance with the following logical expressions.

$$D'0 = \tfrac{1}{2}(\overline{D1}\ D2 + D0\ D2) + D0\ \overline{D2}$$
$$D'1 = \tfrac{1}{2}(D0\ \overline{D1} + \overline{D0}\ D1\ \overline{D2}) + D1\ D2$$

Figure 7:
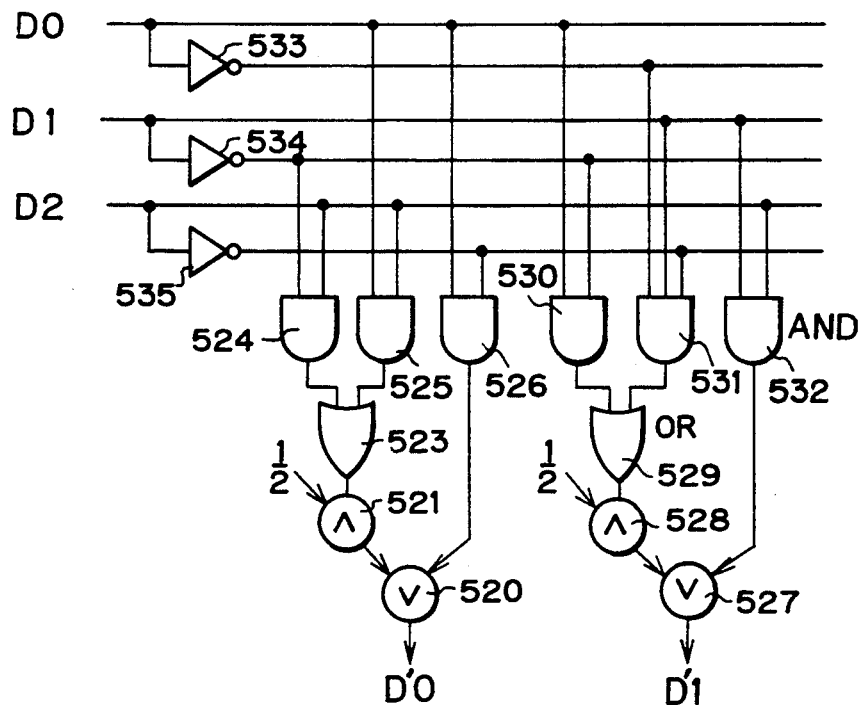
FIG. 7 is a logic diagram for converting binary data into ternary data.

TABLE 2 shows code conversion between binary digits D0, D1, and D2 and ternary digits D'0 and D'1. FIG. 7 shows a logic circuit for generating ternary signals D'0 and D'1 by executing the above logical expressions. As shown in FIG. 7, this logic circuit comprises inverting amplifiers 533 to 535 for inverting binary signals D0, D1 and D2, AND circuits 524 to 526, 530 to 532 for selectively receiving binary signals D0, D1 and D2 and signals from the inverted amplifiers 533 to 535, an OR circuit 523 connected to the outputs of the AND circuits 524 and 525, an OR circuit 529 connected to the outputs of the AND circuits 530 and 531, AND circuits 521 and 528 connected at one input thereof respectively to the outputs of the OR circuits 523 and 529 and receiving a signal of $\frac{1}{2}$ state at the other input thereof respectively, an OR circuit 520 connected to the outputs of the AND circuit 526 and the AND circuit 521, and an OR circuit 527 connected to the outputs of the AND circuit 532 and the AND circuit 528.

Then, ternary signal D'0 is outputted from the OR circuit 520 and ternary signal D'1 is outputted from the OR circuit 527 in accordance with TABLE 2.

Figure 8:
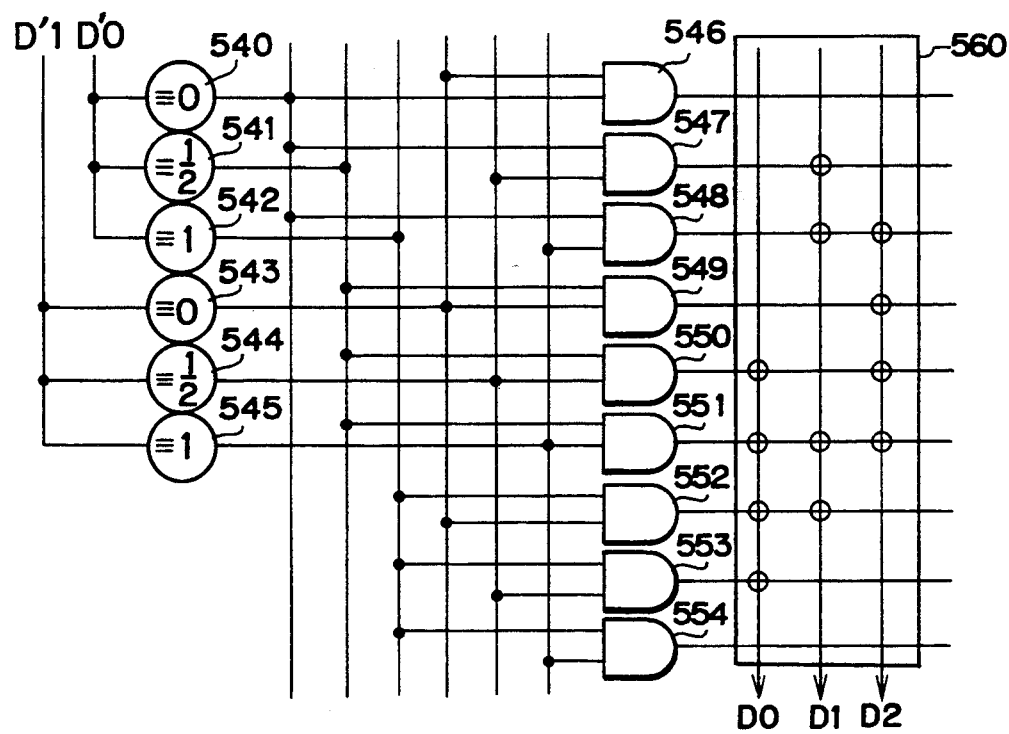
FIG. 8 is a logic diagram for converting ternary data into binary data.

FIG. 8 shows a logic circuit for converting ternary signals D'0 and D'1 into binary signals D0, D1 and D2. As shown in FIG. 8, the logic circuit comprises equivalent circuits 540 to 542 for receiving ternary signal D'0, equivalent circuits 543 to 545 for receiving ternary signal D'1, AND circuits 546 to 554 for selectively receiving outputs of the equivalent circuits 540 to 545, and an OR circuit 560 connected to outputs of AND circuits 546 to 554.

Figures 9A, 9B, 9C:
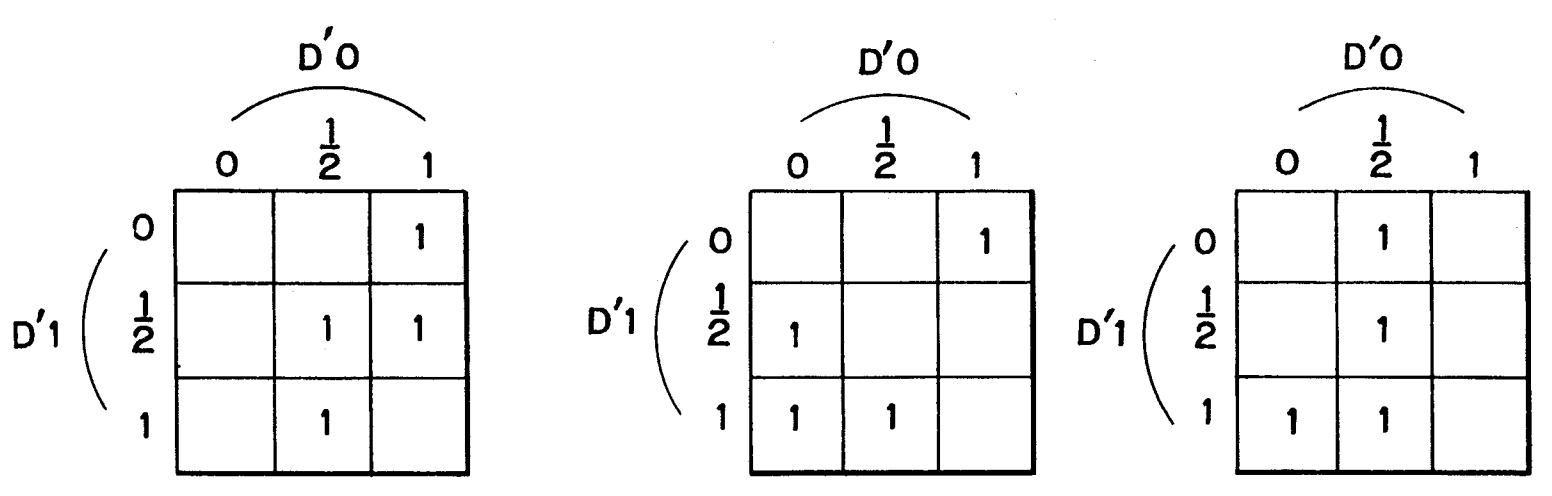

FIG. 9A shows code conversion between binary digit D0 and ternary digits D'0 and D'1, FIG. 9B shows code conversion between binary digit D1 and ternary digits D'0 and D'1, and FIG. 9C shows code conversion between binary digit D2 and ternary digits D'0 and D'1. For example, as shown in FIG. 9A, when ternary digit D'0 is 1 and digit D'1 is 0 or $\frac{1}{2}$ and when digit D'0 is $\frac{1}{2}$ and digit D'1 is $\frac{1}{2}$ or 1, binary digit D0 is 1, and when ternary digits are other than those values, binary digit is 0.

The present invention is not limited to the above-mentioned embodiments, but can be applied to other types of computers, such as CISC (complex instruction set computer), RISC (reduced instruction set computer) and MISC (multiple instruction set computer) or the like regardless of the bit length of the CPU.

Code conversion rules applied to binary/quaternary conversion circuit or binary/ternary conversion circuit are shown above as examples. Many other code conversion rules are possible. Therefore, there are a large number of logic circuits which embody such code conversion rules. In quaternary logic, for example, code conversion rules shown in TABLE 3 may be used.

As has been described, the central processing unit according to the present invention has conversion circuits for converting binary data, a binary address and binary control signals supplied from the internal binary logic circuit into n-valued data (n is an integer of 3 or larger), an n-valued address, and n-valued control signals and outputting converted signals to the outside, and converting n-valued data supplied from the outside into a binary data and outputting the binary data to the above-mentioned binary logic circuit. Therefore, the number of signal lines of the data bus or the address bus can be reduced without decreasing the data transmission rate. The component density can be increased without impairing the electrical stability and reliability.

Many widely different embodiments of the present invention may be constructed without departing from the spirit and the scope of the present invention. It should be understood that the present invention is not limited to the specific embodiments described in the specification, except as defined in the appended claims.

TABLE 1

| BINARY DATA | | QUATERNARY DATA |
|---|---|---|
| D1 | D0 | D'0 |
| 0 | 0 | 0 |
| 0 | 1 | 1/3 |
| 1 | 0 | 2/3 |
| 1 | 1 | 1 |

TABLE 2

| BINARY DATA | | | TERNARY DATA | |
|---|---|---|---|---|
| D0 | D1 | D2 | D'0 | D'1 |
| 0 | 0 | 0 | 0 | 0 |
| 0 | 1 | 0 | 0 | 1/2 |
| 0 | 1 | 1 | 0 | 1 |
| 0 | 0 | 1 | 1/2 | 0 |
| 1 | 0 | 1 | 1/2 | 1/2 |
| 1 | 1 | 1 | 1/2 | 1 |
| 1 | 1 | 0 | 1 | 0 |
| 1 | 0 | 0 | 1 | 1/2 |

TABLE 3

| BINARY DATA | | QUATERNARY DATA |
|---|---|---|
| D1 | D0 | D'0 |
| 0 | 0 | 0 |
| 1 | 0 | 1/3 |
| 1 | 1 | 2/3 |
| 0 | 1 | 1 |

What is claimed is:

1. An N-bit central processing unit comprising:
a binary logic circuit;
bus means connected to said binary logic circuit and provided with N signal lines for transmitting a piece or binary logic information from and to said binary logic circuit;
connect means provided with at least a set of M signal lines for receiving and transmitting a piece of n-valued logic information from and to outside said central processing unit, wherein $M = N \cdot \log(2)/\log(n)$ and n is an integer of 3 or larger;
first means for converting in parallel a binary data of N bits, a binary address of N bits and binary control data of N bits supplied via said bus means from said binary logic circuit into an n-valued data of M digits, an n-valued address of M digits and an n-valued control data of M digits, and transmitting the converted data, address and control data to said connect means to deliver said converting data toward outside the central processing unit; and
second means for converting in parallel an n-valued address of M digits, an n-valued address of M digits and an n-valued control data of M digits supplied from said connect means into a binary data of N bits, a binary address of N bits and binary control data of N bits, and transmitting said converted data, address and control data to said binary logic circuit via said bus means.

2. A central processing unit according to claim 1, wherein said first and second conversing means are composed of a bidirectional binary/n-valued conversion circuit including logical circuits.

3. A central processing unit according to claim 2, wherein said bidirectional binary/n-valued conversion circuit is a bidirectional binary/quaternary conversion circuit for converting a piece of binary information into a piece of quaternary information and vice versa.

4. A central processing unit according to claim 3, wherein said bidirectional binary/n-valued conversion circuit is a bidirectional binary/ternary conversion circuit for converting a piece of binary information into a piece of ternary information and vice versa.

5. A computer comprising:
a. a central processing unit including
 (a) a binary logic circuit;
 (b) bus means connected to said binary logic circuit and provided with three sets of N signal lines for transmitting a binary logic data, a binary address and a binary control data from and to said binary logic circuit;
 (c) connect means provided with three sets of M signal lines for receiving and transmitting an n-valued logic data, an n-valued address and n-valued control data from and to outside said central processing unit, wherein $M = N \cdot \log(2)/\log(n)$ and n is an integer of 3 or larger;
 (d) first means for converting in parallel a binary data of N bits, a binary address of N bits and a binary control data of N bits supplied via said bus means from said binary logic circuit into an n-valued data of M digits, an n-valued address of M digits and an n-valued control data of M digits, and transmitting the converted data, address and control data to said connect means to deliver them toward outside the central processing unit; and
 (e) second means for converting in parallel an n-valued data of M digits, an n-valued address or M digits and an n-valued control data of M digits supplied from said connect means into a binary data of N bits, a binary address of N bits and a binary control data of N bits, and transmitting the converted data, address and control data to said binary logic circuit via said bus means;
b. a data bus connected to said central processing unit through said connect means and provided with M signal lines for transmitting an n-valued data;
c. an address bus connected to said central processing unit through said connect means and provided with M signal lines for transmitting an n-valued address;

d. a control data bus connected to said central processing unit through said connect means and provided with M signal lines for transmitting an n-valued control data;

e. a storage unit connected said data bus, address bus and control bus and provided with an n-valued/binary address conversion circuit for converting an n-valued address applied thereto through said address bus from said central processing unit into a binary address; and f. a peripheral unit connected said data bus, address bus and control bus and provided with an n-valued/binary address conversion circuit for converting an n-valued address applied thereto through said address bus from said central processing unit into a binary address.

6. A computer according to claim 5, wherein said first and second converting means of said central processing unit are composed of a bidirectional binary/n-valued conversion circuit including logical circuits.

7. A computer according to claim 5 or 6, wherein said storage unit includes a binary memory section and a bidirectional n-valued/binary data conversion circuit coupled to said binary memory section and said central processing unit via said data bus for converting an n-valued data applied thereto through said data bus from said central processing unit into a binary data.

8. A computer according to claim 5 for 6, wherein said storage unit includes an n-valued memory section coupled to said central processing unit via said data bus for storing an n-valued digital data.

9. An input/output device comprising:

bus means provided with N signal lines for transmitting a piece of binary logic information;

connect means provided with M signal lines for receiving and transmitting a piece of n-valued logic information from and to outside said device, wherein $M = N \cdot \log(2)/\log(n)$ and n is an integer of 3 or larger;

first means for converting in parallel a piece of binary logic information of N bits supplied via said bus means into a piece of n-valued logic information of M digits, and transmitting the converted information to said connect means to deliver it toward outside said input/output device; and second means for converting in parallel a piece of n-valued logic information of M digits supplied from said connect means into a piece of binary logic information of N bits, and transmitting the converted information to said bus means;

wherein said first and second converting means are composed of a bidirectional binary/n-valued conversion circuit including logical circuits.

10. An input/output device according to claim 9, said device includes an N-bit microprocessor connected with said bus means.

11. An input/output device according to claim 9, wherein said device includes an N-bit word size memory device connected with said bus means.

12. An input/output device according to claim 11, wherein said bidirectional binary/n-valued conversion circuit is a bidirectional binary/quaternary conversion circuit for converting a piece of binary information into a piece of quaternary information and vice versa.

13. An input/output device according to claim 11, wherein said bidirectional binary/n-valued conversion circuit is a bidirectional binary/ternary conversion circuit for converting a piece of binary information into a piece of ternary information and vice versa.

* * * * *